US006584205B1

(12) United States Patent
Croft, III et al.

(10) Patent No.: US 6,584,205 B1
(45) Date of Patent: Jun. 24, 2003

(54) MODULATOR PROCESSING FOR A PARAMETRIC SPEAKER SYSTEM

(75) Inventors: James J. Croft, III, Poway, CA (US); Michael E. Spencer, Redondo Beach, CA (US); Joseph O. Norris, Ramona, CA (US)

(73) Assignee: American Technology Corporation, San Diego, CA (US)

( * ) Notice: Subject to any disclaimer, the term of this patent is extended or adjusted under 35 U.S.C. 154(b) by 0 days.

(21) Appl. No.: 09/384,084

(22) Filed: Aug. 26, 1999

(51) Int. Cl.[7] ................................................ H03G 5/00
(52) U.S. Cl. ........................................ 381/98; 381/103
(58) Field of Search .............................. 381/111, 98, 3, 381/6, 14, 15, 16, 55, 59, 77, 96, 103; 704/200, 201; 367/118

(56) References Cited

U.S. PATENT DOCUMENTS

| | | | | | |
|---|---|---|---|---|---|
| 3,825,834 | A | * | 7/1974 | Stuart et al. | 375/301 |
| 4,418,404 | A | * | 11/1983 | Gordon et al. | 367/132 |
| 4,823,908 | A | | 4/1989 | Tanaka et al. | 181/175 |
| 4,991,687 | A | | 2/1991 | Oyaba et al. | 181/145 |
| 5,406,634 | A | | 4/1995 | Anderson et al. | 381/82 |
| 5,582,176 | A | | 12/1996 | Swerling et al. | 600/455 |
| 5,859,915 | A | | 1/1999 | Norris | 381/75 |
| 5,889,870 | A | * | 3/1999 | Norris | 381/77 |

OTHER PUBLICATIONS

Willette et al, "Harmonics of the Difference Frequency in Saturation–Limited Parametric sources", J. Acoustical Society of America, vol. 62, No. 6, Dec. 1977.*
Aoki et al, "Parametric Loudspeaker Characteristics of Acoustic Field and Suitable Modulation of Carrier Ultrasound," Electronics and Communications in Japan, Part 3, vol. 74, No. 9, 1991.*

Yoneyama et al, "The Audio Spotlight:An application of nonlinear interaction of sound waves to a new type of loudspeaker design", J. Acoustical Society of America,vol. 73, No. 5. May 1983.*

Moffett and Mellen, "Model for Parametric Acoustic Sources," J. Acoust. Soc. Am., vol. 61, No. 2, Feb., 1977.

Willette and Moffett, "Harmonics of the Difference Frequency in Saturation–Limited Parametric Sources," J. Acoust. Soc. A.m., vol. 62, No. 6, Dec., 1977.

Aoki, Kamakura and Kumamoto, "Parametric Loudspeaker—Characteristics of Acoustic Field and Suitable Modulation of Carrier Ultrasound," Electronis and Communications in Japan, Part 3, vol. 74, No. 9, 1991.

(List continued on next page.)

*Primary Examiner*—Marsha D. Banks-Harold
*Assistant Examiner*—Angela Armstrong
(74) *Attorney, Agent, or Firm*—Thorpe North & Western, LLP

(57) ABSTRACT

A parametric loudspeaker system using improved modulators to compensate for the non-linearity of the parametric process in air when driving the air at saturation levels and below saturation levels. The parametric loudspeaker uses a pre-processed single sideband modulator that offers ideal linearity as characterized by square root pre-processed double sideband modulators but with a lower carrier frequency and without the wide bandwidth requirements. By eliminating some or all of the lower sideband the carrier frequency can be reduced without producing sideband frequencies in the audible range. Lower operational frequencies result in greater translation efficiency and greater output capability before reaching the saturation limit of air. A pre-processor minimizes the effects of saturation limits for double sideband, truncated double sideband or single sideband processing to achieve superior output.

18 Claims, 12 Drawing Sheets

OTHER PUBLICATIONS

Yoneyama and Fujimoto, "The audio spotlight: An application of nonlinear interaction of sound waves to a new type of loudspeaker design," J. Acoust. Soc. Am., 73 (5) May, 1983.

Kite et al, "Parametric Array in Air: Distortion Reduction by Preprocessing" (2 pages).

Kite et al., "Parametric Array in Air: Distortion Reduction by Preprocessing" (11 pages).

Pompei, "The Use of Airborne Ultrasonics for Generating Audible Sound Beams," AES, Sep. 26–29, 1998.

Kamakura et al., "Developments of Parametric Loudspeaker for Practical Use", *10th ISNA*, (pp. 147–150).

Berktay, H.O., "Possible Exploitation of Non–Linear Acoustics in Underwater Transmitting Applications", *J. Sound Vib.* (1965) (pp. 435–461).

Kamakura et al., "Suitable Modulation of the Carrier Ultrasound for a Parametric Loudspeaker", *ACUSTICA*, (pp. 215–217).

* cited by examiner

MODULATOR PROCESSING FOR A PARAMETRIC SPEAKER SYSTEM

TECHNICAL FIELD

This invention relates to parametric loudspeakers which utilize the non-linearity of air when excited by high frequency or ultrasonic waves for reproducing frequencies in the audible range. In particular, this invention relates to signal processing and modulators for parametric loudspeakers.

BACKGROUND ART

A parametric array in air results from the introduction of sufficiently intense, audio modulated ultrasonic signals into an air column. Self demodulation, or down-conversion, occurs along the air column resulting in an audible acoustic signal. This process occurs because of the known physical principle that when two sound waves with different frequencies are radiated simultaneously in the same medium, a sound wave having a wave form including the sum and difference of the two frequencies is produced by the non-linear interaction (parametric interaction) of the two sound waves. So, if the two original sound waves are ultrasonic waves and the difference between them is selected to be an audio frequency, an audible sound is generated by the parametric interaction. However, due to the non-linearities in the air column down-conversion process, distortion is introduced in the acoustic output. The distortion can be quite severe and 30% or greater distortion may be present for a moderate modulation level. Lowering the modulation level lowers the distortion, but at the expense of both a lower output volume and a lower power efficiency.

In 1965, Berktay formulated that the secondary resultant output (audible sound) from a parametric loudspeaker is proportional to the second time derivative of the square of the modulation envelope. It was shown by Berktay that the demodulated signal, p(t), in the far-field is proportional to the second time derivative of the modulation envelope squared.

$$p(t) \propto \frac{\partial^2}{\partial t^2}[(env(t))^2] \qquad \text{(Equation 1)}$$

This is called "Berktay's far-field solution" for a parametric acoustic array. Berktay looked at the far-field because the ultrasonic signals are no longer present there (by definition). The near-field demodulation produces the same audio signals, but there is also ultrasound present which must be included in a general solution. Since the near-field ultrasound isn't audible, it can be ignored and with this assumption, Berktay's solution is valid in the near-field too.

The earliest use of this relationship for parametric loudspeakers in air was a modulator design for parametric loudspeakers in 1985. This advancement included the application of a square root function to the modulation envelope. Using the square root function compensates for the natural squaring function which distorts the envelope of the modulated sideband signal emitted to the air. Those skilled in the art have also shown that the square root double sideband signal can theoretically produce a low distortion system but at the cost of infinite system and transducer band width. It is not practical to produce any device that has an infinite bandwidth capability. Further, the implementation of any significant bandwidth means that the inaudible ultrasonic primary frequencies will, on the lower sideband, extend down into the audible range and cause new distortion which is at least as bad as the distortion eliminated by the infinite bandwidth square root pre-processing system.

In a typical application, the desired signal is amplitude modulated (AM) modulated on an ultrasonic carrier of 30 kHz to 50 kHz, then amplified, and applied to an ultrasonic transducer. If the ultrasonic intensity is of sufficient amplitude, the air column will perform a demodulation or down-conversion over some length (the length depends, in part, on the carrier frequency and column shape). The prior art, such as U.S. Pat. No. 4,823,908 to Tanaka, et al., teaches that the modulation scheme to achieve parametric audio output from an ultrasonic emission uses a double sideband signal with a carrier frequency and sideband frequencies spaced on either side of it by the frequency difference corresponding to the audio frequencies of interest.

For example, when amplitude modulating a 6 kHz tone onto a 40 kHz carrier, as shown in FIG. 1, sideband frequencies are generated. FIG. 2 shows that the carrier frequency (40 kHz) is now accompanied by a 34 kHz lower-sideband and a 46 kHz upper-sideband. Three components are now present, 34 kHz, 40 kHz, and 46 kHz which gives a pure 6 kHz envelope. As described previously, the 6 kHz signal would be square rooted before being used as the modulation signal shown in FIG. 3. Using a spectrum produced by the square root function for the modulation signal of a 40 kHz carrier generates the spectral components shown in FIG. 4. Applying a square root function to the 6 kHz signal produces infinite harmonics, and the AM spectrum has upper and lower sideband frequencies that are also infinitely far from the carrier. It is infeasible to implement this type of system because of transducer bandwidth limitations and similar problems.

In practice, the first five or six harmonics are enough to give a good approximation of the ideal square rooted wave. However, even when the number of harmonics is limited, the low sideband frequencies still reach down into the audio range and create distortion. As in the foregoing example in FIGS. 1–4, the lower-sideband frequencies that would need to be emitted are 34, 28, 22, 16, 10 and 4 kHz. This creates the problem that audible frequencies (16, 10, and 4 kHz) will need to be emitted along with the ultrasonic ones to make the desired modulation envelope.

Applying a square root function to the original signal reduces or eliminates the distortion in the demodulated audio but it creates unwanted audible frequencies that are emitted. In the current state of the prior art, the only choice is between high distortion (avoiding the square root function) or a wide bandwidth requirement with less distortion (using a square root function). Further, the square rooted signal for any given ultrasonic frequency is only valid for low level signals. As the ultrasonic power levels are increased to provide significant audio output, the ideal envelope shifts from the square root of the signal to the audio signal itself (or 1 times the signal).

Another problem exhibited by parametric loudspeaker systems is that as the frequency and/or intensity of the ultrasonic sound waves is increased to allow room for lower sidebands and to achieve reasonable conversion levels in the audible range, the air can be driven into saturation. This means that the fundamental ultrasonic frequency is limited as energy is robbed from it to supply the harmonics. The level at which the saturation problem appears is reduced 6 dB for every octave the primary frequency is increased. In other words, the power threshold at which saturation appears, decreases as the frequency increases. Double sideband signal systems used with parametric arrays must always be at least the bandwidth of the signal above any audible frequency (assuming a 20 kHz bandwidth) and even more if the distortion reducing square root function is used which also demands an infinite bandwidth.

A further problem with prior art parametric loudspeakers is that they have a built in high pass filter characteristic such that the amplitude of the secondary signal (audio output) falls at 12 dB per octave for descending frequencies. Because the lower sideband of a double sideband system must be kept from producing output in the audible range, the carrier frequency must be kept at least 20 kHz above the audible upper limit for double sideband (DSB) and at the very least twice that amount with a square rooted DSB. This range forces the carrier frequency up quite high. As a result, the saturation limit is easily reached and the overall efficiency of the system suffers.

These excessive and undesirable types of distortion preclude the practical or commercial use of the uncompensated parametric arrays or even square-rooted compensation schemes in high fidelity applications. Accordingly, it would be an improvement over the state of the art to provide a new method and system for pre-processing the audio signal which would result in lowered distortion with a decreased bandwidth requirement for the ultrasonic parametric array output. It would also be desirable to use lower primary frequencies which are still above the audible range to produce less saturation and attenuation.

OBJECTS AND SUMMARY OF THE INVENTION

It is an object of the present invention to provide a method and apparatus to reduce the primary frequencies of a parametric loudspeaker system to thereby minimize air saturation and increase the conversion efficiency.

It is another object of the present invention to provide a parametric loudspeaker system which corrects distortion without increasing the required bandwidth to reduce the distortion.

It is another object of the present invention to provide a method and system for pre-processing an audio signal that will result in lower distortion and better reproduction of an acoustic audio signal for a parametric array output.

Another object of the present invention is to provide a parametric loudspeaker system that uses a double sideband modulated signal which has a truncated lower sideband.

It is another object of the present invention to provide a parametric loudspeaker system using pre-processed single sideband modulation with reduced bandwidth requirements.

Yet another object of the present invention is to provide a parametric loudspeaker system to eliminate the extended lower sideband of a double sideband modulation scheme used with parametric loudspeakers.

The presently preferred embodiment of the present invention is a signal processor for a parametric loudspeaker system used in air. The signal processor has an audio signal input and a carrier frequency generator to produce a carrier frequency. The audio signal and the carrier frequency are mixed together by a modulator to produce a modulated signal with sideband frequencies which are divergent from the carrier frequency by the frequency value of the audio signal. An error correction circuit is included to compensate for the inherent squaring function distortion by modifying the modulated signal substantially within said modulated signal's bandwidth to approximate the ideal envelope signal. The error correction circuit compares the modulated signal envelope to a calculated ideal square rooted audio signal and generates an inverted error difference which is then added back into the modulated signal to correct for parametric loudspeaker distortion. In one embodiment, an error correction step adds new errors but at a greatly reduced level. This comparison and adding back of the error difference to the original signal can be recursively implemented to decrease the error to a desired level. Each level of recursive error correction tends to reduce the error significantly and enough levels of recursive correction should be used to correct the distortion without adding so many levels that more distortion is added. In alternative embodiments of the present invention, the modulated signal can use forms which include but are not limited to a double sideband signal, a truncated double sideband signal or a single sideband signal.

These and other objects, features, advantages and alternative aspects of the present invention will become apparent to those skilled in the art from a consideration of the following detailed description taken in combination with the accompanying drawings.

DISCLOSURE OF THE INVENTION

Figure 1:
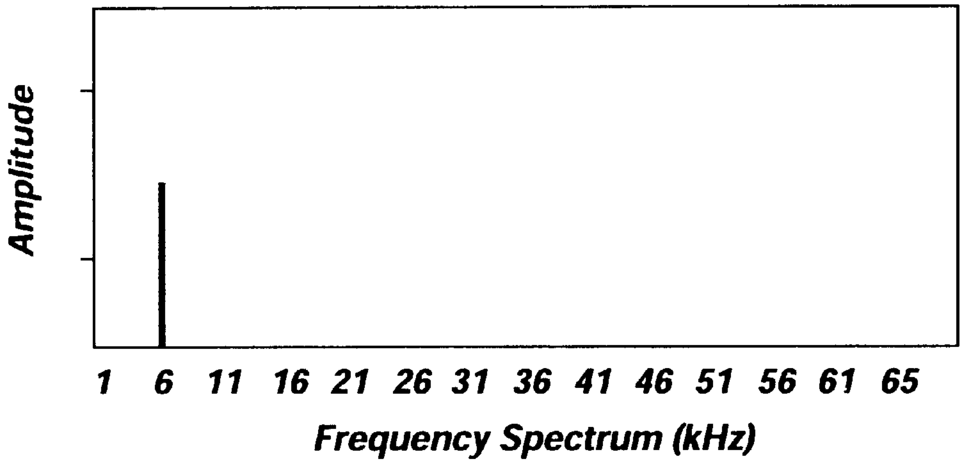
Fig. 1 (PRIOR ART)
FIG. 1 shows a 6 kHz tone.

Reference will now be made to the drawings in which the various elements of the present invention will be given numerical designations and in which the invention will be discussed so as to enable one skilled in the art to make and use the invention. It is to be understood that the following description is only exemplary of certain embodiments of the present invention, and should not be viewed as narrowing the claims which follow.

This invention is a signal processing apparatus and method, implemented either digitally or in analog, which significantly reduces the audible distortion of a parametric array in air. Within this invention, multiple signal processing steps are performed. The input side of the processor(s) accepts a line-level signal from an audio source such as a CD player. In the digital implementation, an analog audio signal will first be digitized or a direct digital input may be received. The first step in the invention multiplies the incoming audio signal by a higher ultrasonic carrier frequency to create a modulated signal. In other words, the carrier frequency is modulated by the incoming audio signal to generate a conventional single sideband (SSB) or double sideband (DSB) signal. The carrier signal is generated by a local oscillator set at the desired frequency. Note that in a multi-channel system (stereo, for example) only one oscillator is preferably used so that all channels have exactly the same carrier frequency. This modulation may produce either a single-sideband (upper sidebands only) (SSB) multiplied with a carrier signal, or a double sideband (DSB) multiplied with a carrier signal. A truncated double sideband (TDSB) signal may also be produced in the invention, where the lower sidebands of a double sideband (DSB) signal are sharply truncated by a filter so nearly all of the frequencies passed are above the carrier.

Next, the calculated envelope of the modulated signal is compared to the calculated "ideal" audio signal with the square root applied. This comparison uses the modulated carrier envelope to compare against the ideal audio signal with the square root applied. The ideal signal is the unmodulated audio signal after it has been offset by a positive DC (direct current) voltage equal in magnitude but opposite to its maximum negative peak value and then square rooted. As mentioned, this is because the audio signal that demodulates in a parametric speaker is proportional to the square of the modulation envelope. Therefore, an envelope that is proportional to the square root of the incoming audio will be converted back to the original audio signal upon demodulation in the medium.

The frequency response of the ultrasonic transducer to be used is also taken into account in the comparison. In other words, a correction is also added which accounts for the distortion created by the transducer (i.e. speaker) when it emits the ultrasonic signals. Before the envelopes are compared, the modulated signal's bandwidth or spectrum is multiplied by the actual frequency response curve of the transducer/amplifier combination. This ensures that the comparison between the ideal envelope and the modulated signal envelope is valid because the modulated signal envelope will be altered by the transducer/amplifier when it is emitted. An embodiment using truncated double side band (TDSB) may be partially truncated by the transducer's high-pass frequency response, or the modulation scheme itself may also truncate the TDSB before it reaches the transducer. This makes it possible to use a simple DSB multiplier unit to generate a conventional DSB signal and a filter and the transducer to convert the DSB signal into a TDSB signal.

The modulated signal envelope is then compared or subtracted from the ideal square rooted signal. This gives a new signal that represents the error. This new signal is then inverted (in phase or in sign) and summed with the original incoming audio signal just ahead of the modulation step. This serves to alter the resulting envelope so that it is a closer match to the ideal envelope. A significant feature of the present invention is the error terms that are calculated and then added back into the audio signal are always within the audio bandwidth of the original audio signal and no extra bandwidth is required. In another embodiment of the invention, the primary distortion correction occurs within the audio signal but some of the distortion correction terms may be outside of the audio signal if the added terms do not produce significant distortion.

Adding the calculated error correction does not correct the envelope in one step, because the envelope's frequency spectrum is not proportional to the incoming audio frequencies only. The envelope is proportional to the square root of the sum of the squares of the modulation spectrum and the modulation spectrum shifted by 90 degrees. In other words, each introduced correction frequency produces other smaller error frequencies that must also be corrected. Accordingly, the error correction is preferably done recursively a number of times until the SSB, DSB or TDSB envelope error versus the ideal signal is within a desired small amount. The number of recursive steps will depend on the desired amount of distortion reduction and on the practical limits of the processor. The modulated signal is then output to an amplifier and ultimately to the ultrasonic transducer where it is emitted into the air or some other medium. The ultrasonic waves then demodulate into the original audio signal according to Berktay's solution.

In one embodiment of the invention, each recursive step reduces the total harmonic distortion (THD) error percentage by at least one-half, with the actual amount depending on the incoming spectrum and the modulation method chosen. The number of recursive steps is dependent upon the processing power available and the desired level of correction. Generally, a half-dozen iterations or less of the recursion process produces the desired distortion correction. The processing power required for this level of correction in real-time is low and could be implemented on an inexpensive DSP chip, or equivalent hardware. As previously described, a carrier modulated by a square rooted audio signal has infinite bandwidth and cannot be emitted accurately by any known means. Using this method makes it possible to approximate the ideal envelope without requiring the substantially increased bandwidth that is otherwise required. It should be recognized that error correction could be performed with only one level of error correction if desired. Analog circuitry could also be used instead of a digital or software implementation of the invention.

In a digital embodiment of the invention, the modulated signal which is an ultrasonic frequency would usually be converted back into analog form before amplification. A high sampling rate is needed for a faithful digital to analog conversion in the output stage. For example, if the SSB carrier frequency was 35 kHz, and the input audio bandwidth was 20 kHz (the nominal value), the output signal would have a spectrum from 35 kHz to 55 kHz. A sampling rate of 96 kHz or higher would be a good choice. The standard 44.1 kHz tends to be insufficient for wideband audio. In contrast, certain applications for speech could use lower sampling rates. Further, the output signal for the digital implementation is at line level. This signal would be input to an ultrasonic amplifier which would in turn drive the transducer. Again, the demodulated signal is proportional to the square of the modulation envelope. At higher ultrasonic amplitudes where saturation comes into play, the demodulated audio begins to be proportional to the envelope itself, not its square. This can be taken into account in the error correction compensator if the final drive level is known. For example, if the amplifier and the signal processor were integrated, the error correction scheme could vary with the power output in relation to the the amplifier settings. Varying the error correction with the power output is described in more detail later. For simpler systems, the square of the envelope can be used as the demodulation model with good results.

By using a SSB or a TDSB system, the carrier frequency and modulated signal frequencies can be lowered without worrying about the lower sidebands which would otherwise be emitted in the audible range (i.e. audible distortion). The carrier frequency and modulated signal frequencies can be lowered so they are close to the upper limit of the audible range. In this invention, close is defined, as close to the upper limit of the audible range as possible without producing significant distortion and where the carrier signal and sidebands are inaudible.

A lower carrier frequency allows for better conversion efficiency in three ways. First, the attenuation rate of the ultrasound is lower so the effective ultrasonic beam length is longer, and the available energy isn't absorbed by the medium quite so quickly. Second, the shock formation (saturation) length is increased for a given sound pressure level (SPL), so a higher SPL can be used. The higher the SPL used, the greater the conversion efficiency (between ultrasonic and audio). In fact, the amplitude of the audio signal generated is proportional to the square of the ultrasonic SPL. In other words, the gain of the system increases with increasing drive levels, until the saturation limit is reached. The saturation limit is increased by lowering the carrier frequency. Third, a lower carrier frequency increases the volume velocity available to the system and therefore increases the available output in the audible range.

For example, the single sideband (SSB) method is used to specifically decrease the carrier frequency as far as possible which maximizes the efficiency of the ultrasonic-to-audio conversion. With a lower frequency saturation carrier, higher saturation levels can be achieved because the acoustic saturation limit is higher with longer acoustic wavelengths. The ideal envelope can be created using only the upper sidebands of a carrier modulated by an audio signal.

Figure 2:
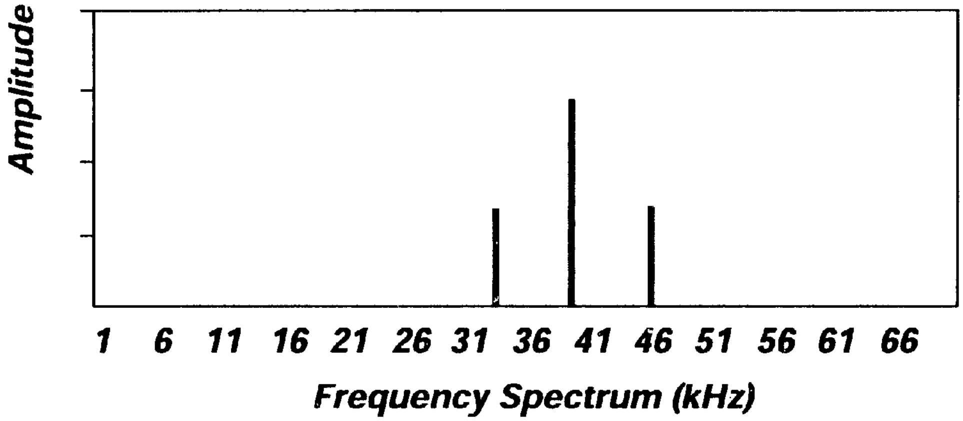
Fig. 2 (PRIOR ART)
FIG. 2 shows a 6 kHz signal modulated onto a 40 kHz carrier signal.
Figure 3:
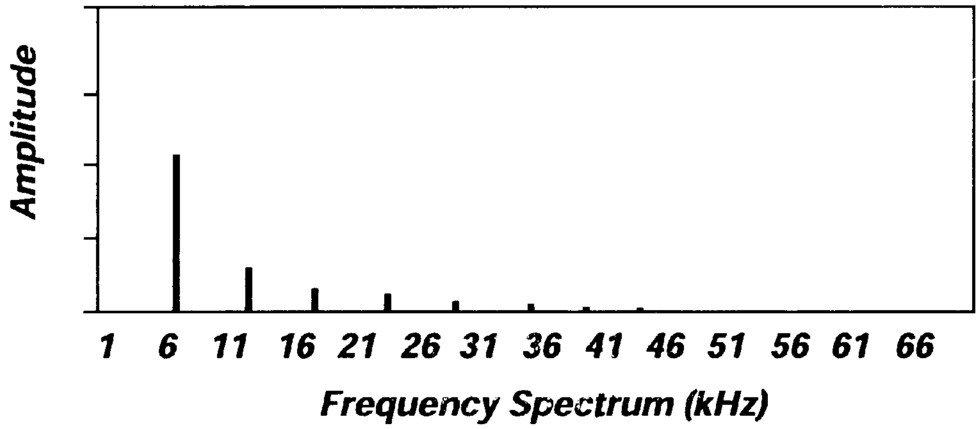
Fig. 3 (PRIOR ART)
FIG. 3 shows the frequency spectrum of a 6 kHz signal after the application of the square root function.
Figure 4:
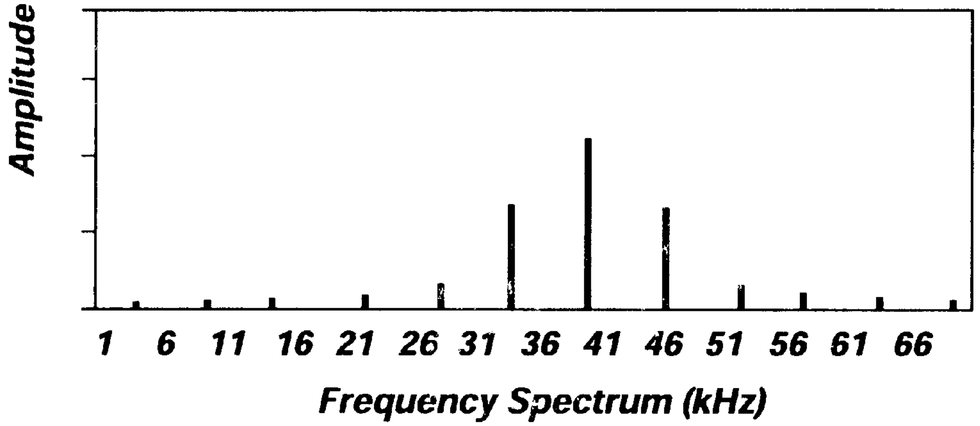
Fig. 4 (PRIOR ART)
FIG. 4 shows a 6 kHz signal after application of the square root function and modulation onto a 40 kHz carrier signal.
Figure 5:
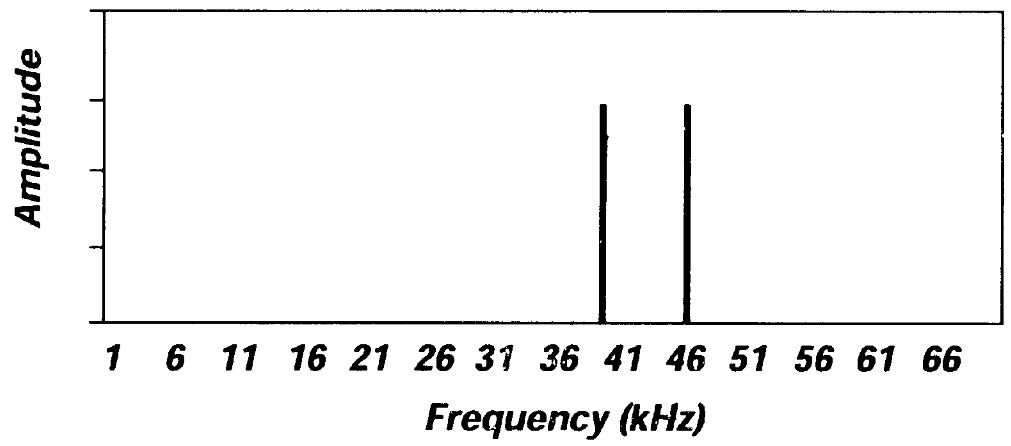
FIG. 5 shows the modulation of a 6 kHz single sideband signal modulated onto a 40 kHz carrier.

There are several additional advantages to using single sideband (SSB) amplitude modulation. These benefits include: eliminating the need to apply the square root function to the audio, reducing the transducer bandwidth requirements, and greater ultrasonic conversion efficiency because lower carrier frequencies are used. In order to make the ideal envelope to create a single audio tone, SSB without a square root applied gives exactly the same envelope as offsetting, applying the square root, re-offsetting, and using double sideband (DSB) AM. To create a 6 kHz tone when using SSB the following spectra are needed as shown in FIG. 5. This is much simpler than the double sideband (DSB) of FIG. 4 or FIG. 2. The envelope and the demodulated audio which results from the spectra in FIG. 5 is exactly what is generated by the infinite spectra in FIG. 4, if it were possible to implement the hardware required to generate FIG. 4. Thus, applying a square root and the associated offsets can be eliminated with the SSB method. This is a great advantage because the distortion and the logic required are reduced.

Figure 6:
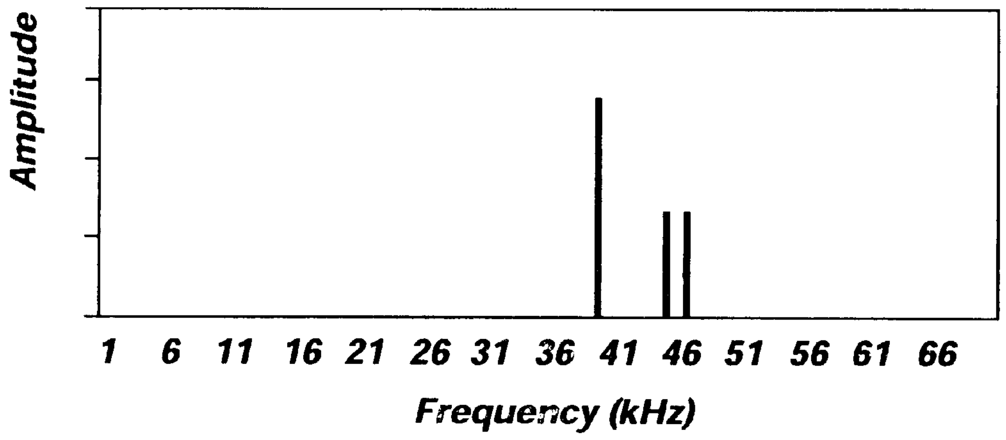
FIG. 6 is a 5 kHz and 6 kHz single sideband signal modulated onto a 40 kHz carrier.
Figure 7:
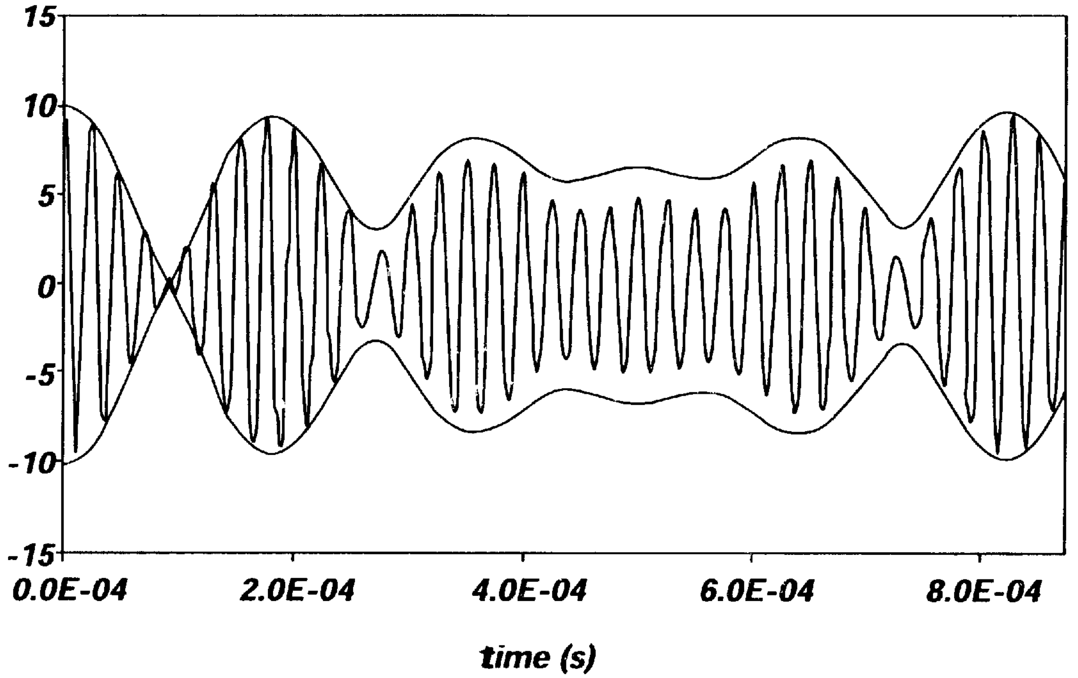
FIG. 7 is the ideal envelope shape with the square root function applied which would result from the single sideband spectrum.
Figure 8:
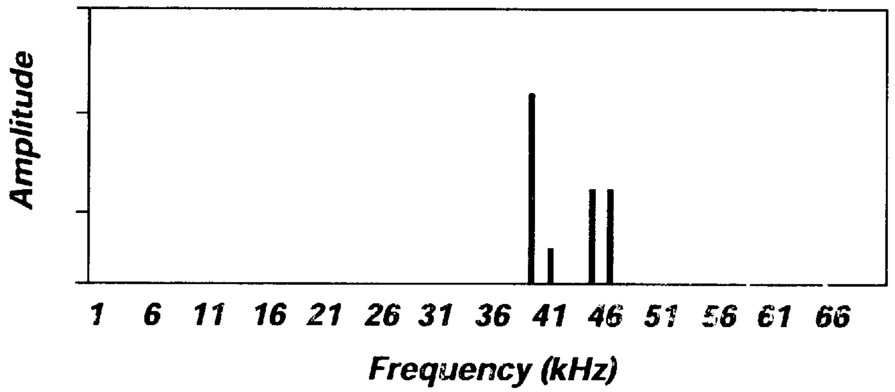
FIG. 8 shows the insertion of artificial sideband frequencies to model the ideal envelope shape of FIG. 7.

Of course as the complexity of the audio signal increases, the SSB method becomes less of a perfect substitute for the full square root method. However, by artificially adding extra upper sideband components within the signal bandwidth, SSB can be made to match the ideal envelope very closely. FIG. 6 shows the reproduction of simultaneous 5 kHz and 6 kHz tones. This SSB spectra would normally look like what is shown in FIG. 6. The ideal envelope shape with the square root applied is shown in FIG. 7 which is the waveform that would result from the SSB spectrum in FIG. 6. It is important to note that the amplitude of the SSB signal does not always match the desired envelope shape. However, if another upper sideband component is artificially inserted, a much better fit can be achieved. FIG. 8 shows where a new component is inserted for this example so that the SSB signal more closely represents the ideal wave form of FIG. 7. The new frequency component in this case is 41 kHz. Adding in additional frequencies is a very simplified version of the error correction that was described above. In each case where additional frequencies are added, the new sideband frequency is equal to the carrier plus the difference between the two upper sidebands. In this example, the carrier is 40 kHz and the dominant sideband frequencies are 5 kHz and 6 kHz so the artificial sideband is 41 kHz, and no extra bandwidth is required when inserting this new component. Essentially, the two frequencies with dominant magnitudes can always be used to determine the location of the new sideband.

Using a SSB or TDSB scheme is advantageous because it more ideally matches the amplitude output of a typical ultrasonic transducer above and below its resonant frequency. For example, the carrier in an SSB or TDSB arrangement would be placed at the fundamental resonant frequency of the transducer for maximum speaker output levels, and the upper sideband frequencies would fall on the upper side of the resonant peak where the transducer operates efficiently. Many transducers work well above the resonance frequency, and poorly below this peak frequency.

Now a more detailed embodiment of the invention which uses a recursive error correction scheme will be discussed and block diagrams of the invention will be described. Although the preferred TDSB method is discussed, SSB or DSB are also thoroughly described. In the invention, a distortion compensator is positioned after the modulator to cancel first-order distortion products. A first order base-band compensator is used which can also be recursively extended to an Nth order distortion compensator. The base-band compensators pre-distort the audio signal prior to modulation. When the first order distortion correction is applied it creates smaller distortion terms which are then corrected in the next level of recursion. Significant distortion improvements have been shown using the Nth order compensator with various modulation schemes.

Figure 9A:
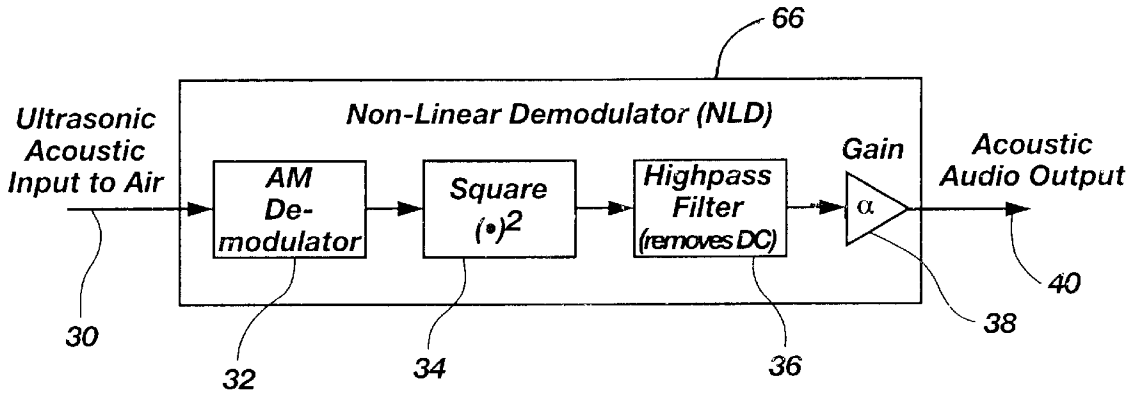
FIG. 9A is a non-linear demodulator model for a parametric array in air.

The first component of the invention models the non-linear demodulation which occurs in the air column of a parametric speaker. This relationship must be modeled to provide a proper approximation of the distortion which is needed to produce the correct acoustic sound wave. The second derivative function in Berktay's solution (Equation 1) presents a linear distortion that may be compensated for by passing the audio signal through a double integrator prior to subsequent processing and modulation. Since the focus here is to control the non-linear distortion component, the derivative which can be handled by simple equalization techniques will be dropped from this discussion. FIG 9A shows a block diagram representation of a non-linear demodulator which does not model the second derivative. Ultrasonic acoustic waves 30 are emitted into the air which performs a demodulation function modeled by the AM demodulator 32. Since an audio signal can't contain a DC term, a high-pass filter 30 has been added to the model to remove the DC component from the output of the squarer block 32. A gain constant, a is included at 38 for scaling purposes and an acoustic audio output is then generated 40. The air column demodulator in the figure is referred to as the non-linear demodulator or NLD.

Figure 9B:
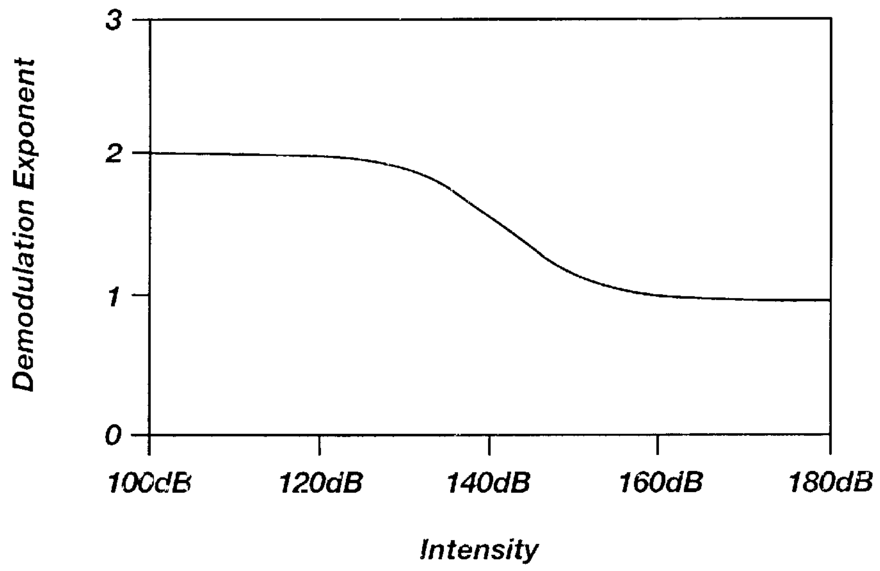
FIG. 9B shows a graph of the damping function used for the demodulation exponent.

In an alternative embodiment of the invention, the squaring function in the non-linear demodulator uses an exponent which decreases as the intensity of the ultrasonic signal increases. The demodulation exponent of this invention can increase from ½ to 1 in a smooth curved fashion or it can be linearly interpolated from ½ to 1. Increasing the exponent, models the air saturation that takes place as the power of the ultrasonic signal increases. FIG. 9B shows the damping function of the demodulation exponent with respect to the intensity in decibels of the ultrasonic signals. It should be realized based on this disclosure that applying a damping function is similar to pre-processing the signal by applying the square root at lower signal power and then increasing the square root function to 1 as the power of the signal and saturation increase. This function which interpolates the square root up to one can be modeled as either a linear function, quadratic ($n^2$) function or a cubic ($n^3$) function.

Figure 10:
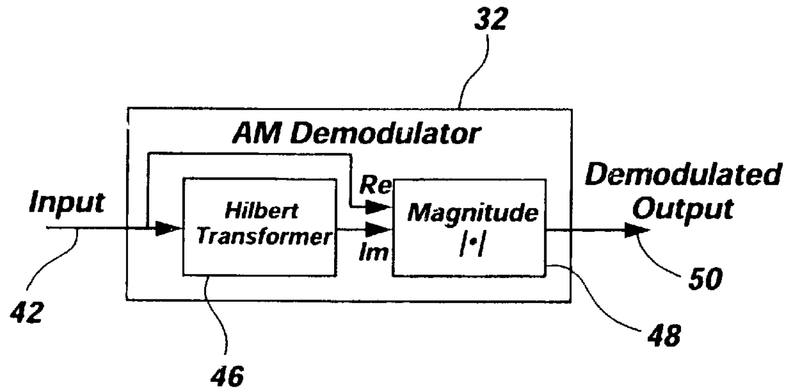
FIG. 10 is an AM demodulator based on a Hilbert transformer.

FIG. 10 expands the AM demodulator block of FIG. 9A with the ideal instantaneous AM demodulator based on the Hilbert transformer. An ultrasonic signal is received at the input 42 and passed to the Hilbert transformer 46. The Hilbert transformer 46 is a linear filter that simply shifts the phase of any input tone by 90 degrees without affecting its amplitude. For example, an input of b cos (ωt) is transformed to an output of b sin (ωt). The magnitude block 48 computes the square root of the sum of the squares of the real and imaginary inputs, thus extracting the signal's instantaneous amplitude which provides a demodulated output 50.

Figure 11:
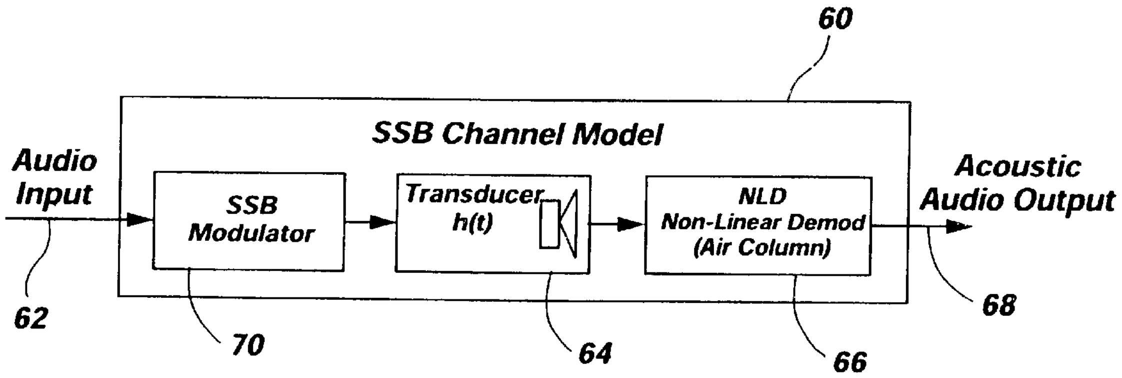
FIG. 11 is a single sideband channel model.

An SSB channel model 60 will now be described which models an uncompensated parametric array system that uses a SSB modulator 70. Referring now to FIG. 11, a single sideband (SSB) channel model 60 is constructed by adding a SSB modulator 70 and the ultrasonic transducer response 64 in front of the non-linear air column demodulator (NLD) 66. An audio input 62 enters the SSB channel model and an acoustic audio output 69 model is produced. The ultrasonic transducer 64 (i.e. speaker) is modeled by the linear filter, h(t) and is typically bandpass in nature. The NLD details are given in the description of FIG. 9A.

Figure 12:
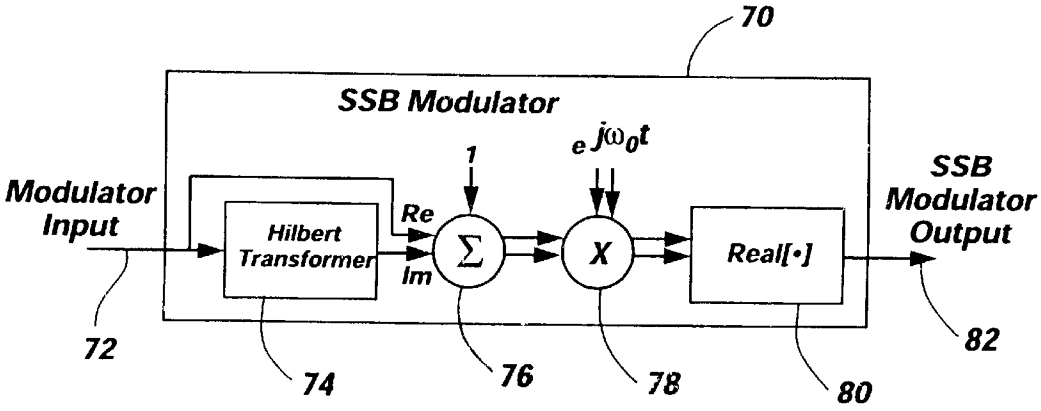
FIG. 12 is a more detailed view of the single sideband modulator in FIG. 11.

The SSB modulator 70 is expanded in FIG. 12 and specifically performs upper sideband modulation with carrier feed-through. It is assumed that there is no DC term present in the modulator input 72. The modulator input 72 is received and the Hilbert transformer 74 is used to derive the complex analytic signal having real RE and imaginary parts IM prior to the summing node 76. Unlike a real signal, with its negative frequency components equal to the conjugate of its positive frequencies, it can be shown that the analytic signal has no negative frequency components. The modulator 78 modulates the analytic signal with $e^{j\omega_0 t}$, and right shifts its spectrum by $\omega_0$. The constant, 1 is added to the signal path in the summing node 76 to cause some carrier signal to pass through. Taking the real part 80 restores the negative frequency components of the signal. In effect, the single sideband modulator shifts the audio spectrum right by $\omega_0$ and adds a carrier tone at $\omega_0$.

To summarize the SSB method, the distortion of a SSB modulator with discrete tone input signals can be reduced by this invention. The distortion products have frequencies that are equal to the differences of the primary input signals. Additionally, the distortion tones have a lower amplitude than the primary input tones if the modulation index is less than one (amplitude of the carrier signal is greater than the peak modulated signal amplitude). So, if additional input tones are injected at the distortion frequencies it completely cancels these "first-order" distortion products. The result is that "second-order" distortion products are introduced at the additional tone difference frequencies. However, the amplitude of the secondary distortion products is significantly less than the original distortion amplitude, resulting in an overall improvement of distortion figures. Application of additional canceling tones in a recursive manner further improves output distortion.

Injecting weak tones at the distortion frequencies improves the overall distortion. Distortion-tone injection works by observing the amplitude of the distortion and injecting a tone with the same amplitude and opposite phase. This works because the SSB channel model passes input tones without significant amplitude or phase modification, and superposition (summation) applies at the acoustic output facilitating the cancellation. This assumes a unity gain transducer model.

In the preferred embodiment of this invention compensating for the distortion of broad-band signals, not just tones, is desired and the distortion components of a general, wide-band input signal must be estimated. Estimating the distortion in the wide-band modulated signal will now be described.

Figure 13:
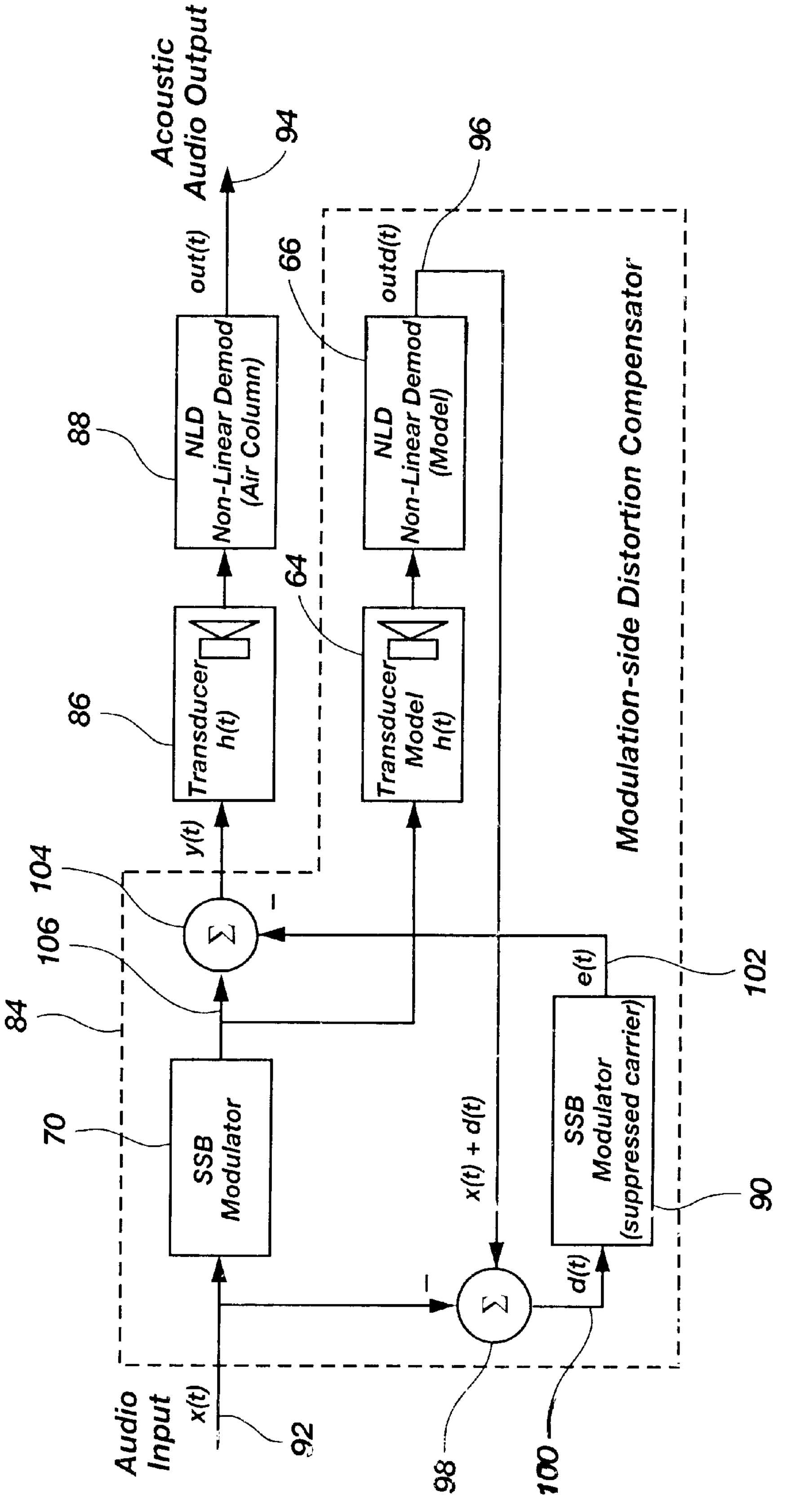
FIG. 13 is a modulation side distortion compensator.

This invention uses a modulation-side distortion compensator, shown in FIG. 13, that predicts, then cancels the first-order distortion components after the SSB modulator. By analyzing the SSB channel model in real time, the distortion component can be estimated as shown in FIG. 13. Assume initially that h(t) is unity or 1. The audio input 92 is SSB modulated 70 and then demodulated with the NLD 66 and transducer model 64, to derive an estimate of the output of the uncompensated parametric array 96, or outd (t)=x(t)+d(t), where x(t) is the desired input signal and d(t) is the distortion. By subtracting the input signal from outd(t) in the summation node 99, we are left with the distortion products d(t), 100. Next, we frequency shift the distortion products up with the SSB (suppressed carrier) modulator 90 to get the modulation error signal e(t), 102. The error signal has no carrier signal present because it was removed in the SSB suppressed carrier modulator 90. This error signal 102 is subtracted from the main modulator output 106 in the adder 104 to mitigate the first order distortion products in the final acoustic output.

This compensator also works for the case the h(t) is approximately unity. The system may be modified to handle an arbitrary transducer response by including a transducer inverse model. This is not detailed here because the base-band distortion compensator discussed below is the most preferred embodiment.

Now, base-band distortion compensators will be addressed. Another method of distortion abatement is to subtract the distortion products from the main modulator input as detailed in FIG. 14. This is known in the invention as a first-order distortion compensator. Here, the transducer response, h(t) is ignored in the SSB channel model 110 because its inverse is applied prior to the actual transducer. The cascade of $h^{-1}(t)$ and h(t) is approximately unity (at least over the frequency range of interest) so tout(t)≡mod(t). The audio distortion is estimated using the SSB Channel Model. A portion of the estimated distortion signal is subtracted from the audio signal, thus reducing distortion in the acoustic output.

In this embodiment of the system, the SSB channel model 110 is used to derive an estimate of the first order distortion products dist(t). The distortion is estimated by using the SSB Channel model 110 to estimate the distortion 114, and then the original audio input 112 is subtracted from the estimated distorted signal 114 leaving the distortion dist(t), 118. This distortion is scaled by the parameter c, ($0<c\leqq 1$), 120 and subtracted 122 from the original audio input 112, resulting in the first-order pre-distorted audio signal, $x_1(t)$ at 124. The cancellation parameter, c controls the percentage of the first-order distortion that is canceled.

Since the SSB channel model produces distortion products with frequencies equal to differences of the inputs, no frequency expansion occurs at any node in the system. Thus, if the input bandwidth is limited to 20 kHz, then the bandwidth of the distortion, dist(t), and pre-distorted signal, $x_1(t)$ are also limited to 20 kHz. The single sideband modulator simply right shifts (translates) the spectrum of $x_1(t)$ and adds a carrier. Therefore, the bandwidth of mod(t) is also limited to 20 kHz (although the center frequency is high). The main implication of this is that the actual transducer bandwidth need only be 20 kHz wide and the inverse filter, $h^{-1}(t)$ need only perform inversion over the 20 kHz band of interest. One of the benefits of this system is that difficult transducer responses may be dealt with easier.

Figure 14:
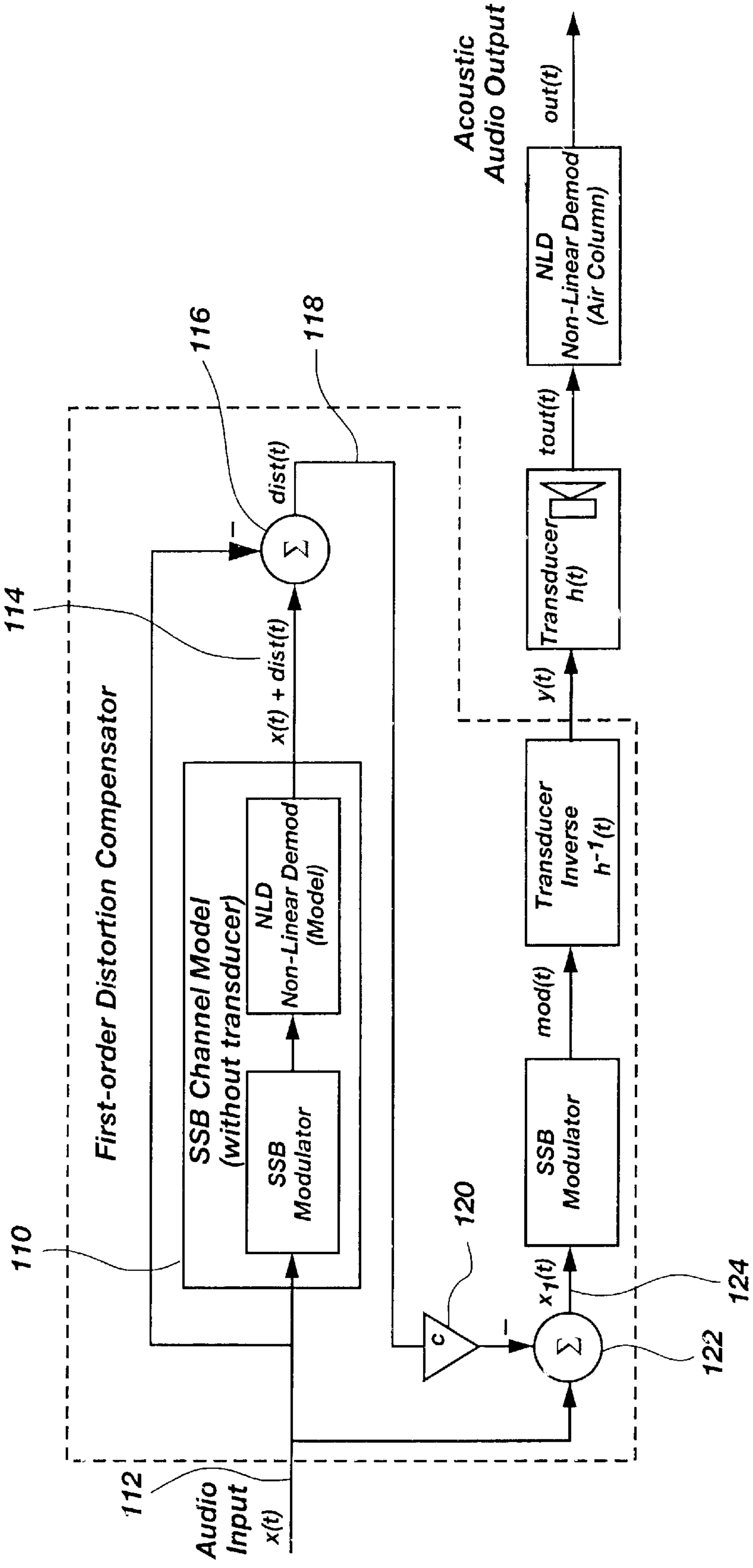
FIG. 14 is a first order baseband distortion compensator.
Figure 15:
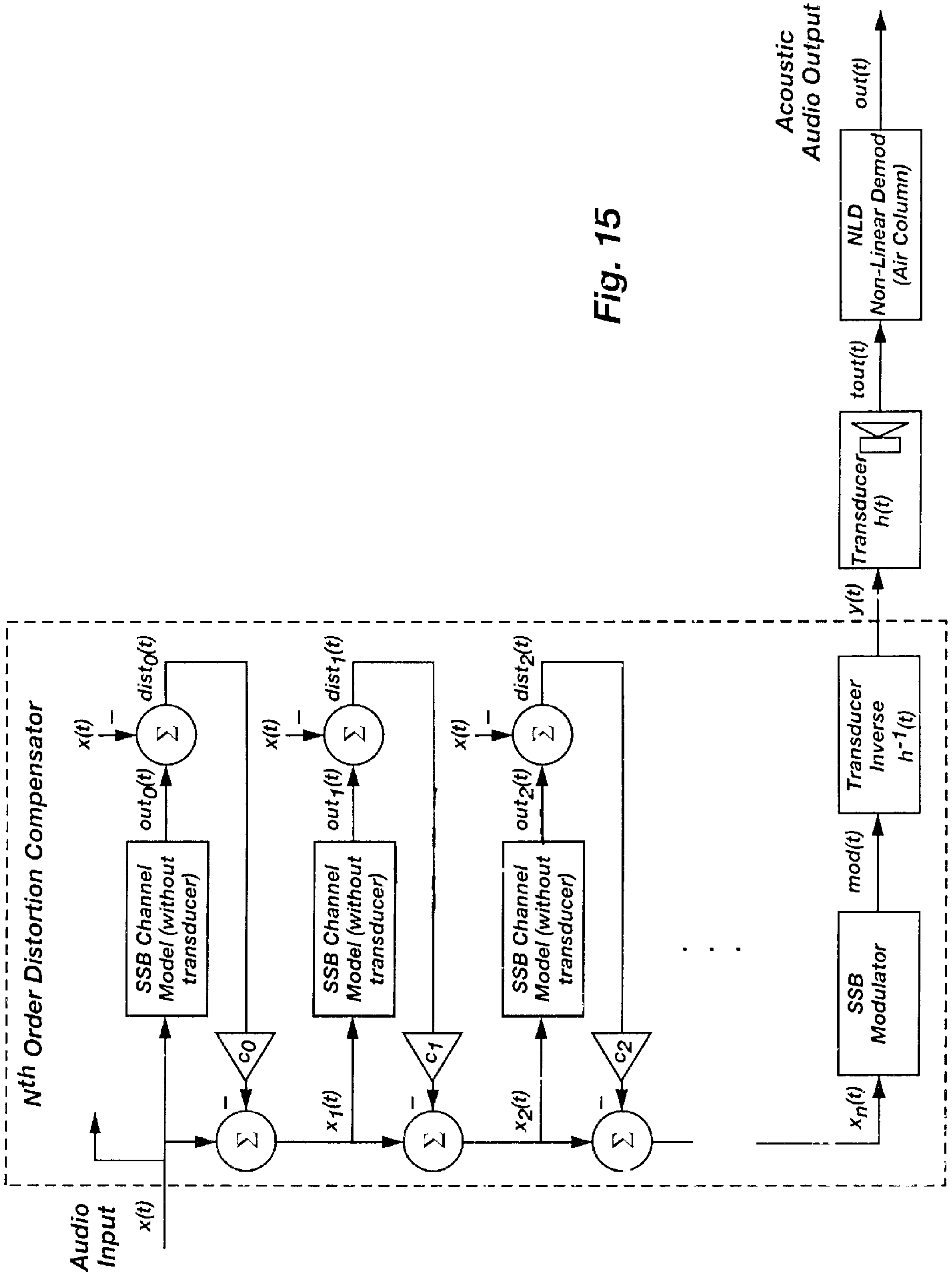
FIG. 15 is a Nth order audio distortion compensator.

The first-order compensator of FIG. 14 is easily extendable to higher order compensators by the recursive application of additional stages. The Nth order distortion compensator is shown in FIG. 15. Here, the pre-distorted signal, $x_1(t)$ is used as the input to another distortion compensator, and so on, until the desired order is reached. FIG. 15 shows that the audio distortion is recursively estimated using SSB Channel Models. A portion of the estimated distortion signal is subtracted from the pre-distorted input by each level of recursion, thus reducing distortion in the acoustic output. There is a point of diminishing returns where no further improvement is attained as the compensator recursion levels are increased, especially for a high modulation index.

Figure 16:
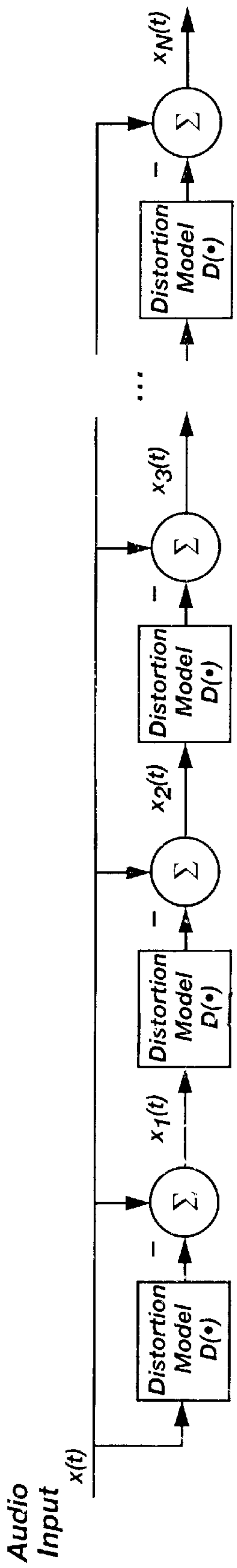
FIG. 16 shows a Nth order audio distortion compensator as a cascade of distortion models.

The Nth order distortion compensator may be also viewed as the cascade of distortion models subtracted from the audio input as shown in FIG. 16. It can be shown that the alternate configuration of the Nth order distortion compensator of FIG. 16 simplifies the block diagram of FIG. 15 and gives additional insight into the operation of compensator. From the block diagram in FIG. 15, we see that the pre-distorted input signals are given by $$x_{i+1}(t)=x_i(t)-c_i(M(x_i(t))-x_0(t)) \quad i=0, 1, 2, \ldots, N-1 \qquad \text{(Equation 2)}$$

where M(•) is the channel model and $x_0(t)$ is defined as the input; $x_0(t)=x(t)$. Next, define the distortion generator system, D(•) as the difference between the channel model output and its input, $$D(x_i(t))=M(x_i(t))-x_i(t). \qquad \text{(Equation 3)}$$

Let the cancellation parameters be unity, $c_i=1$ for all i. Note that $D(x_i(t))$ is the distortion or error signal generated by the non-linear plant. It is zero only when the plant is distortion free. Combining equations (2) and (3), we get an alternative expression for the pre-distorted signals, $$x_{i+1}(t)=x_0(t)-D(x_i(t)) \quad i=0, 1, 2, \ldots, N-1 \qquad \text{(Equation 4)}$$

Equation 4 is depicted in FIG. 16 and shows that the Nth order distortion compensator may viewed as the cascade of distortion models subtracted from the original audio input.

Figure 17:
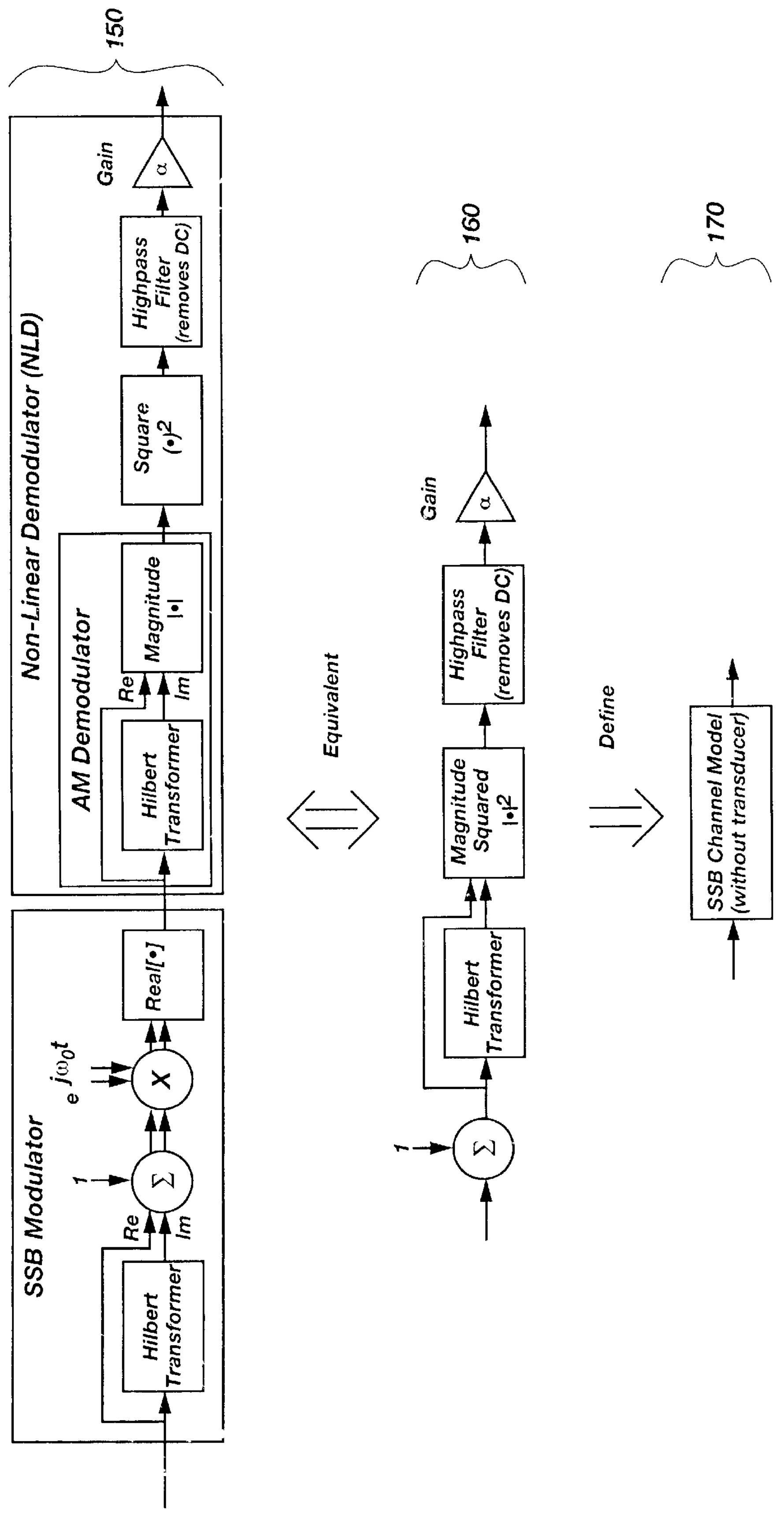
FIG. 17 is a SSB channel model implemented as the magnitude squared of the Hilbert transformed input.

The SSB channel model may simplified which creates a more efficient implementation for the distortion compensators. FIG. 17 shows that the Hilbert transformer based AM demodulator works for any carrier frequency, including to $\omega_0=0$. Making this substitution allows the SSB Channel Model to be realized as the magnitude squared of the Hilbert transformed input.

Since the SSB channel model is used as part of the distortion controller, an efficient implementation is desirable. The SSB channel model (excluding the transducer response) is expanded in the top 150 of FIG. 17. One of the properties of the AM demodulator using the Hilbert transform is that it works independent of the carrier frequency of the modulator. This includes $\omega_0=0$. Making this substitution eliminates the need to do the first Hilbert transform 160, saving a significant amount of circuitry or DSP (digital signal processor) resources, depending on the hardware implementation 170.

Figure 18:
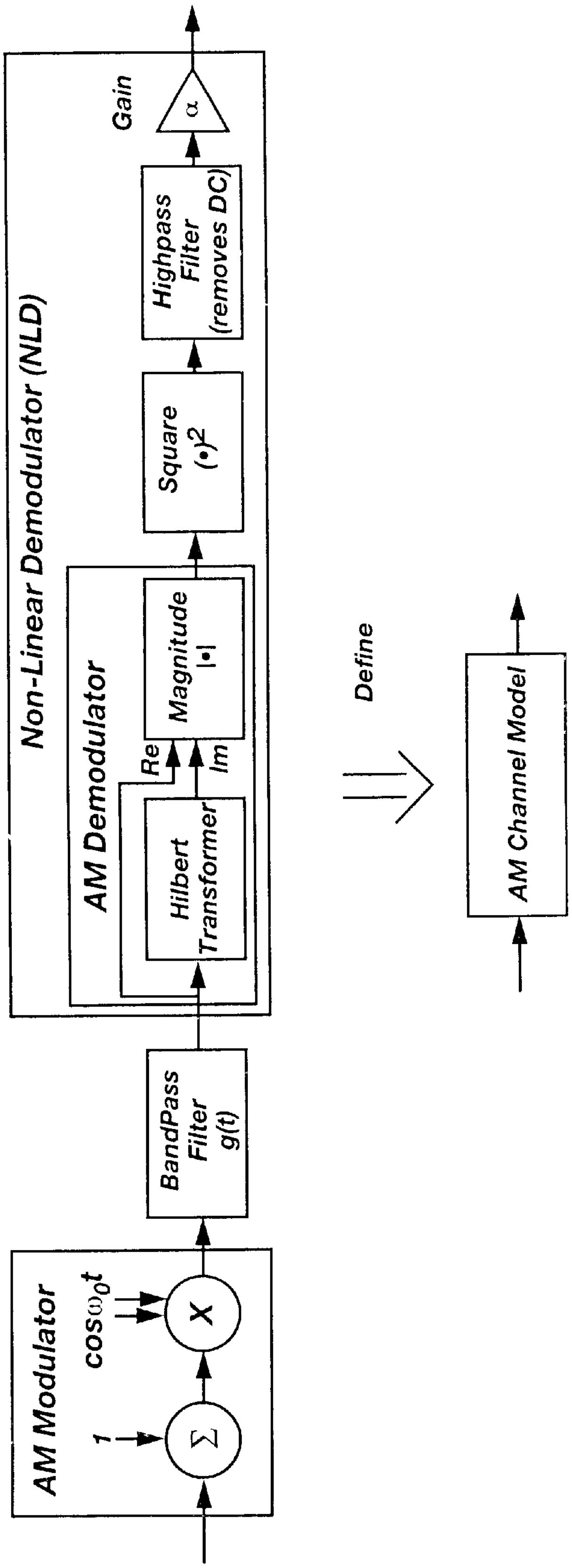
FIG. 18 is an AM channel model using an AM modulator.

The basic principle of the Nth order recursive distortion compensator also works with an amplitude modulator. The channel model must be redefined to include the AM modulator as shown in FIG. 18. Substituting the AM channel model into the base-band compensator results in an effective distortion control system that avoids the complexities of the single sideband modulator. Unlike the SSB case, bandwidth expansion is an issue in the AM case because an AM modulator has the property of doubling the signal's bandwidth. The Nth order distortion compensator of FIG. 15 is modified for the AM case by substituting in the AM channel model from FIG. 18 and the AM modulator in place of the SSB modulator.

The ultrasonic transducer will typically cut off or attenuate a portion of the lower sideband of the AM frequency spectrum. For this reason, the filter g(t), is required in the AM channel model to simulate this attenuation. Minimum requirements for this filter is that it be linear phase filter and have a bandpass characteristic similar to the actual transducer used in the system. The filter should be modeled as the cascade of a compensation filter and the transducer filter, that is $$g(t)=h_{comp}(t)*h(t) \qquad \text{(Equation 5)}$$

where "*" is the convolution operator, $h_{comp}(t)$ is the compensation filter, and h(t) is the transducer response.

There are two alternative approaches to designing the compensation filter. The first option is to choose $h_{comp}(t)$ as the approximate inverse of the transducer response h(t). This choice will flatten out the amplitude response of the cascade g(t), and linearize the phase. In this case, g(t) is a model of the cascade of the transducer inverse and the transducer filters as in the bottom portion of FIG. 15. This is the preferred option because very low order (first-order) distortion controllers are effective.

The second option is to compensate only for the phase of the transducer model with $h_{comp}(t)$. Gain variations with frequency will be present in the cascade g(t). In this case, for example, a pair of equal amplitude tones may emerge at the output with different amplitudes. This amplitude error will be treated as distortion. The effect of the Nth order compensator will equalize the amplitude difference between the two tones and improve the distortion. However, performance suffers when compared to using phase and amplitude compensation.

For example, if a transducer with a 40 dB roll-off from 40 kHz to 50 kHz is used, and two equal amplitude tones, 1 kHz and 9 kHz, are input to an uncompensated system, resulting in a ~35 dB amplitude mismatch. A $6^{th}$ order compensator will reduce the amplitude mismatch to only 3 dB. Using both phase and amplitude compensation gives better overall results with only a second order compensator.

Considerable simplification of the AM channel model may be performed if the transducer response is unity over the complete AM modulation spectrum, or a unity response over both upper and lower sideband frequencies, (a 40 kHz bandwidth). A unity response is generally not the case because wide-band transducers are difficult to build.

Another useful simplification is to lower the carrier frequency of the AM modulator in the AM channel model and shift down the frequency response of the filter g(t), so that it is in the correct position relative to the carrier. The final modulator remains at the desired carrier frequency. Only the carrier frequencies of modulators in the AM channel models are reduced. These changes preserve the input/output relationship of the AM channel model, but lower the maximum signal frequency to twice the system bandwidth (e.g. maximum frequency of 40 kHz for a 20 kHz system). This simplifies a DSP based implementation by reducing the sampling rate.

It is to be understood that the above-described arrangements are only illustrative of the application of the principles of the present invention. Numerous modifications and alternative arrangements may be devised by those skilled in the art without departing from the spirit and scope of the present invention. The appended claims are intended to cover such modifications and arrangements.

What is claimed is:

1. A signal processor for a parametric loudspeaker system, comprising:

at least one carrier frequency generator to produce a carrier frequency;

a modulator which receives at least one audio signal and modulates the at least one audio signal onto the carrier frequency to produce a modulated signal, wherein the at least one audio signal is converted to sideband frequencies which are divergent from the carrier frequency by the frequency value of the at least one audio signal;

an error correction compensator coupled to the modulator to compensate for inherent parametric demodulation distortion by modifying, substantially only within the modulated signal's bandwidth, the modulated signal to approximate an ideal signal which should be output by the system;

wherein the error correction compensator adjusts for the inherent parametric demodulation distortion by comparing the modulated signal with a reference signal which models parametric demodulation distortion, and thereby generates an inverted error difference to add back into the modulated signal substantially within the modulated signal's bandwidth to correct for distortion.

2. The signal processor as in claim 1 wherein the error correction compensator further comprises:

a non-linear demodulator to simulate demodulation of an ultrasonic signal;

a transducer model coupled to the non-linear demodulator to simulate a system transducer;

a difference processor coupled to the transducer model to calculate the distortion difference between an original audio signal and a simulated distorted audio signal generated by the non-linear demodulator and the transducer model; and a summing node to add the distortion difference received from the difference processor into the original audio signal.

3. The signal processor as in claim 1 wherein the error correction compensator further comprises a plurality of error correction compensators recursively chained together to apply iterative distortion correction to the modulated signal.

4. The signal processor as in claim 3 wherein the plurality of error correction compensators recursively chained together further comprises recursively chaining error correction compensators less than 8 times.

5. The signal processor as in claim 1 wherein the error correction compensator further comprises a non-linear demodulator to generate a distorted signal which simulates the conversion of ultrasonic modulation input to an acoustic audio output.

6. The signal processor as in claim 5 wherein the non-linear demodulator further comprises:

an AM demodulator to remove the carrier frequency from an ultrasonic acoustic input;

a squaring function processor coupled to the AM demodulator to model secondary resultant output from a parametric loudspeaker which is proportional to the square of the modulation envelope;

a high pass filter coupled to the squaring function to remove a direct current (DC) output component from the squaring function processor; and a gain module coupled to the high pass filter to scale a simulated acoustic audio output.

7. The signal processor as in claim 6 wherein the AM demodulator further comprises:

a Hilbert transformer to shift input tone phases; and a magnitude processor coupled to the Hilbert transformer to compute an instantaneous signal amplitude.

8. The signal processor as in claim 5 wherein the error correction compensator further comprises a single sideband channel module.

9. The signal processor as in claim 8 wherein the single sideband channel module further comprises:

a single sideband modulator to receive the audio signal and modulate the audio signal with a carrier signal;

a transducer response to receive a modulated signal from the single sideband modulator, wherein the transducer response models an uncompensated parametric transducer; and a nonlinear demodulator coupled to the transducer response wherein the demodulator receives modulated signals and models a secondary resultant output from a parametric loudspeaker which is proportional to a square of a modulation envelope.

10. A signal processor for a parametric loudspeaker system used in air, comprising:

a single sideband (SSB) modulator to receive at least one audio signal and modulate a single sideband carrier signal with the audio signal to create a modulated signal having a signal envelope and a bandwidth;

an error correction compensator coupled to receive the modulated signal from the SSB modulator and to substantially match the signal envelope of the single sideband (SSB) modulated signal with an ideal signal which has been pre-processed to correct parametric demodulation distortion, wherein the audio signal contains corrective frequencies which are added substantially only within the audio signal's bandwidth;

wherein the error correction compensator further comprises a non-linear demodulator wherein the demodulator simulates a medium's non-linear distortion.

11. The signal processor as in claim 10 wherein the non-linear demodulator further comprises:

an AM demodulator to remove the ultrasonic carrier signal from an ultrasonic acoustic input;

a squaring function processor coupled to receive the output from the AM demodulator and to model secondary resultant output from a parametric loudspeaker which is proportional to the square of the modulation envelope;

a high pass filter to remove the direct current (DC) component of output of the squaring function processor; and a gain module connected to the high pass filter to scale the acoustic audio output.

12. A method for producing a reduced distortion audio signal for use with a parametric loudspeaker system, comprising the steps of:

(a) receiving at least one audio signal;

(b) producing a carrier frequency which is modulated with the at least one audio signal to produce a modulated signal with sideband frequencies;

(c) compensating for an inherent parametric demodulation distortion in parametric loudspeaker demodulation by modifying the modulated signal with added frequencies substantially only within the modulated signal's bandwidth to closely approximate an ideal modulation envelope;

wherein step (c) further comprises the steps of:

comparing the modulated signal with the ideal signal to which parametric demodulation distortion has been applied, to thereby produce an inverted error signal;

adding the inverted error signal back into the modulated signal to produce a compensated modulated signal which is provided to a transducer for audio reproduction.

13. The method of claim 12 wherein the steps of comparing the modulated signal with the ideal signal and then adding the inverted error signal back into the modulated signal further comprises the step of repeating the comparing and adding steps recursively at least two times.

14. The method of claim 13 wherein the step of recursively repeating the comparing and adding steps further comprises recursively repeating the comparing and adding steps until the error correction is within a selected error amount.

15. The method of claim 13 wherein the step of recursively repeating the comparing and adding steps further comprises recursively repeating the comparing and adding steps less than 8 times.

16. The method of claim 13 wherein the step of recursively repeating the comparing and adding steps further comprises recursively repeating the comparing and adding steps until distortion terms are at a lowest possible value.

17. A signal processor for a parametric loudspeaker system, comprising:

at least one carrier frequency generator to produce a carrier frequency;

a modulator which receives at least one audio signal and modulates the at least one audio signal onto the carrier frequency to produce a modulated signal, wherein the at least one audio signal is converted to sideband frequencies which are divergent from the carrier frequency by the frequency value of the at least one audio signal;

an error correction compensator coupled to the modulator to compensate for transducer distortion by modifying, substantially only within the modulated signal's bandwidth, the modulated signal to approximate an ideal signal which should be output by the system;

wherein the error correction compensator adjusts for the transducer distortion by comparing the modulated signal with a reference signal which models parametric demodulation distortion, and thereby generates an inverted error difference to add back into the modulated signal substantially within the modulated signal's bandwidth to correct for distortion.

18. The signal processor as in claim 17 wherein the error correction compensator further corrects for inherent parametric demodulation distortion by modifying, substantially within the modulated signal's bandwidth, the modulated signal to approximate the ideal signal which should be output by the system; and wherein the error correction compensator adjusts for the inherent parametric demodulation distortion by comparing the modulated signal with a reference signal which models parametric demodulation distortion, and thereby generates an inverted error difference to add back into the modulated signal substantially within the modulated signal's bandwidth to correct for distortion.

* * * * *